(12) United States Patent
Kimura et al.

(10) Patent No.: US 11,539,344 B2
(45) Date of Patent: Dec. 27, 2022

(54) ELASTIC WAVE DEVICE AND METHOD FOR PRODUCING THE SAME

(71) Applicant: Murata Manufacturing Co., Ltd., Nagaokakyo (JP)

(72) Inventors: Tetsuya Kimura, Nagaokakyo (JP); Yutaka Kishimoto, Nagaokakyo (JP); Masashi Omura, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 1101 days.

(21) Appl. No.: 16/167,614

(22) Filed: Oct. 23, 2018

(65) Prior Publication Data

US 2019/0068155 A1    Feb. 28, 2019

Related U.S. Application Data

(63) Continuation of application No. PCT/JP2017/014759, filed on Apr. 11, 2017.

(30) Foreign Application Priority Data

Jun. 7, 2016 (JP) .............................. JP2016-113678

(51) Int. Cl.
*H03H 9/10* (2006.01)
*H03H 9/02* (2006.01)
(Continued)

(52) U.S. Cl.
CPC ...... *H03H 9/1064* (2013.01); *H03H 9/02228* (2013.01); *H03H 9/02992* (2013.01);
(Continued)

(58) Field of Classification Search
CPC ............... H03H 9/02992; H03H 9/058; H03H 9/14502; H03H 9/02535; H03H 9/02228
(Continued)

(56) References Cited

U.S. PATENT DOCUMENTS 9,013,088 B1 * 4/2015 Sparks ............... H03H 9/02228
                                                    310/346
2009/0096321 A1    4/2009 Aikawa et al.
(Continued)

FOREIGN PATENT DOCUMENTS

JP    2006-101092 A    4/2006
JP    2009-094975 A    4/2009
(Continued)

OTHER PUBLICATIONS

Official Communication issued in International Patent Application No. PCT/JP2017/014759, dated May 16, 2017.

*Primary Examiner* — Derek J Rosenau
(74) *Attorney, Agent, or Firm* — Keating & Bennett, LLP

(57) ABSTRACT

An elastic wave device includes a supporting substrate including an upper surface including a recessed portion, a piezoelectric thin film on the supporting substrate to cover the recessed portion of the supporting substrate, an IDT electrode on a main surface of the piezoelectric thin film, the main surface being adjacent to the supporting substrate, and an intermediate layer on a main surface of the piezoelectric thin film, the main surface being remote from the supporting substrate. A space is defined by the supporting substrate and the piezoelectric thin film. The IDT electrode faces the space. Through holes are provided in the piezoelectric thin film and the intermediate layer to extend from a main surface of the intermediate layer to the space, the main surface being remote from the piezoelectric thin film. The elastic wave device further includes a cover member on the intermediate layer and covering opening ends of the through holes.

20 Claims, 11 Drawing Sheets

(51) Int. Cl.
*H03H 9/25* (2006.01)
*H03H 9/05* (2006.01)
*H03H 9/145* (2006.01)

(52) U.S. Cl.
CPC ........ *H03H 9/058* (2013.01); *H03H 9/14502* (2013.01); *H03H 9/25* (2013.01); *H03H 9/02834* (2013.01)

(58) Field of Classification Search
USPC ...... 310/313 R, 313 A, 313 B, 313 C, 313 D
See application file for complete search history.

(56) References Cited

U.S. PATENT DOCUMENTS

| | | |
|---|---|---|
| 2011/0266918 A1 | 11/2011 | Iwamoto et al. |
| 2014/0152145 A1 | 6/2014 | Kando et al. |
| 2014/0152146 A1 | 6/2014 | Kimura et al. |
| 2016/0294354 A1 | 10/2016 | Saijo et al. |

FOREIGN PATENT DOCUMENTS

| | | |
|---|---|---|
| WO | 2010/082571 A1 | 7/2010 |
| WO | 2012/073871 A1 | 6/2012 |
| WO | 2012/086441 A1 | 6/2012 |
| WO | 2015/098679 A1 | 7/2015 |

* cited by examiner $S_0$ MODE LAMB WAVE $S_1$ MODE LAMB WAVE $A_0$ MODE LAMB WAVE $A_1$ MODE LAMB WAVE $SH_0$ MODE $SH_1$ MODE

ELASTIC WAVE DEVICE AND METHOD FOR PRODUCING THE SAME

CROSS REFERENCE TO RELATED APPLICATIONS

This application claims the benefit of priority to Japanese Patent Application No. 2016-113678 filed on Jun. 7, 2016 and is a Continuation Application of PCT Application No. PCT/JP2017/014759 filed on Apr. 11, 2017. The entire contents of each application are hereby incorporated herein by reference.

BACKGROUND OF THE INVENTION

1. Field of the Invention

The present invention relates to an elastic wave device in which an interdigital transducer (IDT) electrode is provided on a piezoelectric thin film, and to a method for producing the elastic wave device.

2. Description of the Related Art

Heretofore, elastic wave devices that use various elastic waves, such as surface acoustic waves, bulk waves, and plate waves, have been proposed. For example, International Publication No. 2010/082571 discloses an elastic wave device that uses a plate wave.

International Publication No. 2010/082571 describes an elastic wave device in which a piezoelectric thin film is supported by a supporting body. In International Publication No. 2010/082571, a space is formed on the supporting body side of the piezoelectric thin film, and an IDT electrode is disposed so as to face that space. In producing the elastic wave device of International Publication No. 2010/082571, a sacrificial layer is formed on the supporting body side of the piezoelectric thin film, and an etching gas, an etching solution, or the like is introduced from an etching window in the piezoelectric thin film so as to etch away the sacrificial layer and to thereby form the space. The sacrificial layer is etched away through a through hole formed in the piezoelectric thin film and extending to the sacrificial layer.

However, with the elastic wave device obtained as in International Publication No. 2010/082571, moisture sometimes penetrates into the IDT electrode unit through the etching window and the space. Thus, the elastic wave device of International Publication No. 2010/082571 has occasionally experienced frequency fluctuation, and the reliability thereof has not been sufficient.

SUMMARY OF THE INVENTION

Preferred embodiments of the present invention provide elastic wave devices that achieve excellent moisture resistance, and methods for producing the elastic wave devices.

An elastic wave device according to a preferred embodiment of the present invention includes a supporting substrate including an upper surface with a recessed portion therein; a piezoelectric thin film including a pair of main surfaces opposite to each other, the piezoelectric thin film being provided on the supporting substrate so as to cover the recessed portion of the supporting substrate; an IDT electrode provided on one of the main surfaces of the piezoelectric thin film, the one of the main surfaces being adjacent to the supporting substrate; and an intermediate layer including a pair of main surfaces opposite to each other, the intermediate layer being provided on the other one of the main surfaces of the piezoelectric thin film, the other one of the main surfaces being remote from the supporting substrate, in which a space is defined by the supporting substrate and the piezoelectric thin film, the IDT electrode is arranged to face the space, a through hole is provided in the piezoelectric thin film and the intermediate layer so as to extend from one of the main surfaces of the intermediate layer to the space, the one of the main surfaces being remote from the piezoelectric thin film, and the elastic wave device further includes a cover member disposed on the intermediate layer so as to cover an opening end of the through hole.

In a particular example of an elastic wave device according to a preferred embodiment of the present invention, the intermediate layer is an acoustic reflecting layer that includes a plurality of acoustic impedance layers, and the plurality of acoustic impedance layers includes at least one low acoustic impedance layer and at least one high acoustic impedance layer having a higher acoustic impedance than the low acoustic impedance layer. In this aspect, the energy of the elastic wave is more efficiently confined.

In another particular example of an elastic wave device according to a preferred embodiment of the present invention, the intermediate layer includes a low acoustic velocity layer in which an acoustic velocity of a bulk wave propagating therein is lower than an acoustic velocity of an elastic wave propagating in the piezoelectric thin film, and a high acoustic velocity layer in which an acoustic velocity of a bulk wave propagating therein is higher than the acoustic velocity of the elastic wave propagating in the piezoelectric thin film, the high acoustic velocity layer being disposed on the low acoustic velocity layer. In this aspect, the energy of the elastic wave is more efficiently confined.

In another particular example of an elastic wave device according to a preferred embodiment of the present invention, the intermediate layer is a low acoustic velocity layer in which an acoustic velocity of a bulk wave propagating therein is lower than an acoustic velocity of an elastic wave propagating in the piezoelectric thin film, and the cover member is a high acoustic velocity layer in which an acoustic velocity of a bulk wave propagating therein is higher than the acoustic velocity of the elastic wave propagating in the piezoelectric thin film. In this aspect, the energy of the elastic wave is more efficiently confined.

In yet another particular example of an elastic wave device according to a preferred embodiment of the present invention, the cover member is made of an inorganic material. In this aspect, the moisture resistance of the elastic wave device is further enhanced.

In yet another particular example of an elastic wave device according to a preferred embodiment of the present invention, the cover member is made of Si. In this aspect, the moisture resistance of the elastic wave device is further enhanced.

In yet another particular example of an elastic wave device according to a preferred embodiment of the present invention, the piezoelectric thin film has a thickness less than or equal to about 1 μm, the intermediate layer has a thickness less than or equal to about 10 μm, and the cover member has a thickness more than or equal to about 25 μm.

A method for producing an elastic wave device according to a preferred embodiment of the present invention includes forming an IDT electrode on a piezoelectric thin film including a pair of main surfaces opposite to each other; forming a sacrificial layer on one of the main surfaces of the piezoelectric thin film so as to cover the IDT electrode; forming a supporting substrate, which includes an upper surface with a recessed portion formed therein, so as to cover the sacrificial layer; forming an intermediate layer including a pair of main surfaces opposite to each other, the intermediate layer being formed on the other one of the main surfaces of the piezoelectric thin film, the other one of the main surfaces being remote from the sacrificial layer; forming a through hole in the piezoelectric thin film and the intermediate layer so that the through hole extends from one of the main surfaces of the intermediate layer to the sacrificial layer, the one of the main surfaces being remote from the piezoelectric thin film; a step of removing the sacrificial layer by etching through the through hole so that a portion where the sacrificial layer has been formed forms a space; and forming a cover member on the one of the main surfaces of the intermediate layer remote from the piezoelectric thin film so as to cover an opening end of the through hole.

According to preferred embodiments of the present invention, elastic wave devices with excellent moisture resistance, and methods for producing the elastic wave devices are provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will now be described with reference to the drawings.

The preferred embodiments described in the present description are merely illustrative, and substitutions or combinations of portions of the structures are possible among different preferred embodiments.

First Preferred Embodiment

Figure 1A:
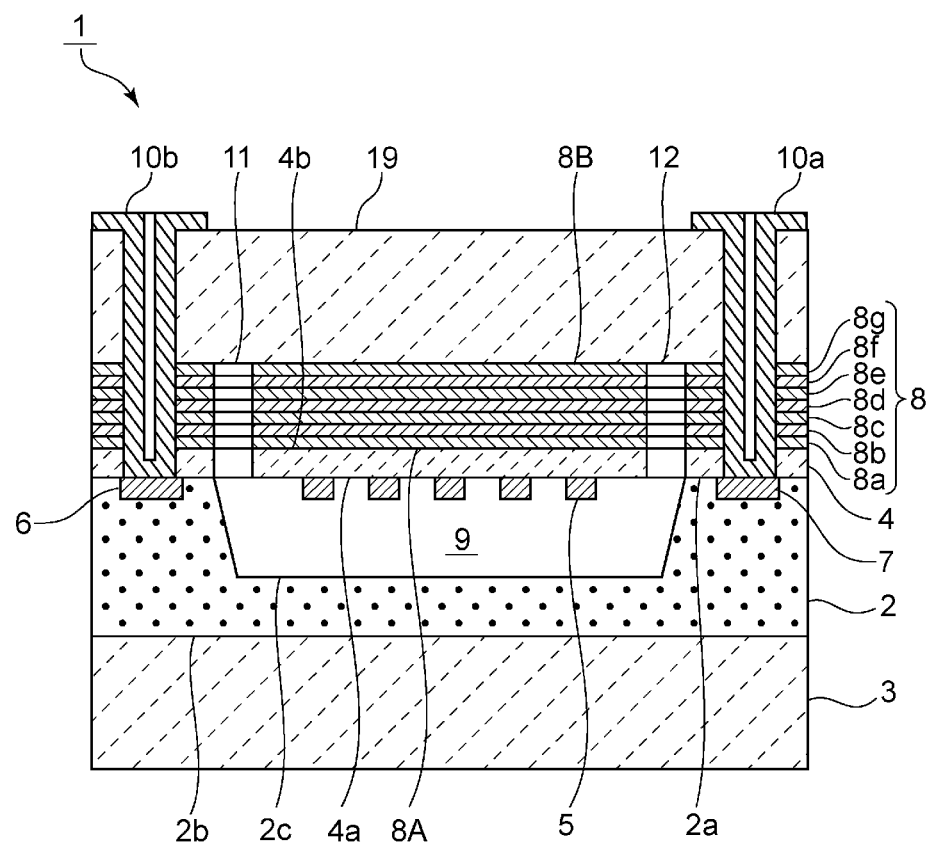
FIG. 1A is a schematic elevational cross-sectional view of an elastic wave device according to a first preferred embodiment of the present invention.
Figure 1B:
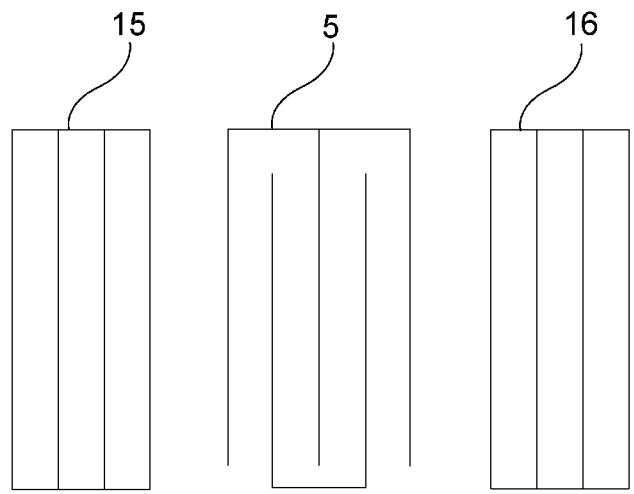
FIG. 1B is a schematic plan view of an electrode structure thereof.

FIG. 1A is a schematic elevational cross-sectional view of an elastic wave device according to a first preferred embodiment of the present invention. FIG. 1B is a schematic plan view of an electrode structure of the elastic wave device according to the first preferred embodiment of the present invention.

An elastic wave device 1 uses a plate wave as a propagating elastic wave. The plate wave referred to herein is a wave, most of the elastic wave energy of which is concentrated in a piezoelectric body having a thickness less than or equal to the wavelength of the elastic wave. Thus, the structure is not limited to a so-called hollow structure in which the piezoelectric body is a thin plate or a thin film. Various thin films may be provided under the thin piezoelectric body so that most of the elastic wave energy is concentrated in the piezoelectric body, or a supporting substrate that supports these piezoelectric body and thin films may be provided.

The elastic wave device 1 includes a supporting substrate 2. The supporting substrate 2 includes an upper surface 2$a$ and a lower surface 2$b$. A recessed portion 2$c$ that opens toward the upper surface 2$a$ is provided on the upper surface 2$a$ side of the supporting substrate 2.

A reinforcing substrate 3 is stacked on the lower surface 2$b$ of the supporting substrate 2. It should be noted that, if the supporting substrate 2 has a sufficiently high strength, the reinforcing substrate 3 need not be provided. Thus, the reinforcing substrate 3 is not an essential element.

The supporting substrate 2 and the reinforcing substrate 3 can be made of an appropriate dielectric, such as silicon dioxide, aluminum oxide, or aluminum nitride, a semiconductor such as Si, or the like. These materials may be used alone or in combination. The supporting substrate 2 and the reinforcing substrate 3 may be made of the same material or different materials.

A piezoelectric thin film 4 is stacked on the upper surface 2$a$ of the supporting substrate 2 so as to cover the recessed portion 2$c$. In the case where a plate wave is used as in this preferred embodiment, the thickness of the piezoelectric thin film 4 is preferably less than or equal to about 1λ, where λ represents the wavelength determined by the electrode finger pitch of an IDT electrode 5. In this case, excitation of the plate wave is further enhanced. It should be noted that, as in the second and third preferred embodiments described below, when an elastic wave device in which a low acoustic velocity layer and a high acoustic velocity layer are provided on a piezoelectric thin film is used, the thickness of the piezoelectric thin film 4 is preferably less than or equal to about 3.5λ, for example.

The piezoelectric thin film 4 is a substrate composed of LiTaO$_3$. Alternatively, a substrate composed of other piezoelectric single crystal, such as LiNbO$_3$, or a substrate composed of a piezoelectric ceramic may be used as the piezoelectric thin film 4.

The piezoelectric thin film 4 includes a first main surface 4a and a second main surface 4b opposite to each other. The piezoelectric thin film 4 is stacked on the upper surface 2a of the supporting substrate 2 while the first main surface 4a faces downward. In other words, the first main surface 4a side of the piezoelectric thin film 4 is disposed on the upper surface 2a of the supporting substrate 2.

Thus, the piezoelectric thin film 4 is disposed to close the recessed portion 2c of the supporting substrate 2. Consequently, the supporting substrate 2 and the first main surface 4a of the piezoelectric thin film 4 define the space 9.

The IDT electrode 5 is disposed on the first main surface 4a of the piezoelectric thin film 4 so as to face the space 9. Thus, when an AC voltage is applied to the IDT electrode 5, a piezoelectric thin film 4 portion where the IDT electrode 5 is provided is excited. The elastic wave device 1 uses, as an elastic wave, a plate wave generated by the excitation of the IDT electrode 5 as described above.

The plate wave referred to herein is a general term for various waves that are excited in a piezoelectric thin plate having a film thickness of less than or equal to about 1λ where the wavelength of the plate wave excited is assumed to be about 1λ. The mechanism is not particularly limited as long as the wave is able to be confined in the thin plate. In other words, a membrane structure in which waves are confined in a piezoelectric thin plate only, or a structure equipped with a plate-wave-reflecting layer disposed near a piezoelectric thin plate, for example, a structure equipped with an acoustic reflecting film, may be used. The modes for the membrane structure in which a plate wave is confined in a piezoelectric thin plate only will now be described. The plate waves are classified into Lamb waves (the main components are components in the elastic wave propagation direction and in the piezoelectric body thickness direction) and SH waves (the main component is the SH component) according to the displacement component. Furthermore, the Lamb waves are classified into symmetrical mode (S mode) and antisymmetric mode (A mode). When a piezoelectric body is folded along a line on the midpoint of the thickness, displacements overlap each other in the symmetrical mode, and displacements run in opposite directions from each other in the antisymmetric mode. The subscripted figure indicates the number of nodes in the thickness direction. For example, an A1-mode Lamb wave is a first-order antisymmetric mode Lamb wave. FIGS. 11A-11F illustrate the S modes and the A modes of Lamb waves, and the propagation modes of SH waves. In FIGS. 11A to 11D, the directions of the arrows indicate the displacement directions of the elastic waves, and in FIGS. 11E and 11F, the thickness directions in the plane of the paper indicates the displacement directions.

Specifically, an electrode structure illustrated in FIG. 1B is provided on the piezoelectric thin film 4 although this is schematically illustrated in FIG. 1A. That is, the IDT electrode and reflectors 15 and 16 disposed on both sides of the IDT electrode 5 in the surface acoustic wave propagation direction are provided. As a result, a one-port surface acoustic wave resonator is provided. The reflectors 15 and 16 are optional.

As illustrated in FIG. 1B, the IDT electrode 5 includes a first busbar, a second busbar, first electrode fingers, and second electrode fingers. The first electrode fingers and the second electrode fingers are interdigitated. The first electrode fingers are connected to the first busbar, and the second electrode fingers are connected to the second busbar.

Although not illustrated in the drawings of this preferred embodiment, a $SiO_2$ film that defines and functions as a temperature-characteristics-adjusting film may be provided so as to cover an IDT electrode according to a preferred embodiment of the present invention.

Referring again to FIG. 1A, electrode lands 6 and 7 are provided on the first main surface 4a of the piezoelectric thin film 4. The electrode lands 6 and 7 are electrically connected to the IDT electrode 5.

The IDT electrode 5 and the electrode lands 6 and 7 are each composed of an appropriate metal or alloy. The IDT electrode and the electrode lands 6 and 7 may each be defined by a multilayer metal film in which multiple metal films are stacked.

An acoustic reflecting layer 8 defining and functioning as an intermediate layer is disposed on the second main surface 4b of the piezoelectric thin film 4. The acoustic reflecting layer 8 includes multiple acoustic impedance layers. In this preferred embodiment, the acoustic reflecting layer 8 includes low acoustic impedance layers 8a, 8c, 8e, and 8g and high acoustic impedance layers 8b, 8d, and 8f. The thickness of the intermediate layer is typically about 0.1 μm to about 10 μm, for example, although this depends on the structure of the intermediate layer and the material for the intermediate layer.

The acoustic impedance of the high acoustic impedance layers 8b, 8d, and 8f is higher than the acoustic impedance of the low acoustic impedance layers 8a, 8c, 8e, and 8g.

In this preferred embodiment, the low acoustic impedance layer 8a is disposed on the second main surface 4b of the piezoelectric thin film 4. Thereon, the high acoustic impedance layers 8b, 8d, and 8f and the low acoustic impedance layers 8c, 8e, and 8g are alternately disposed in the stacking direction. The acoustic reflecting layer 8 may extend from the region where the IDT electrode 5 and the reflectors 15 and 16 are present to the region where the electrode lands 6 and 7 are present, or may be provided only in the region where the IDT electrode 5 and the reflectors 15 and 16 are present. Preferably, the acoustic reflecting layer 8 is provided at least in the region where the IDT electrode 5 is present.

Thus, the plate wave that has propagated from the piezoelectric thin film 4 is reflected at the interfaces between the low acoustic impedance layers 8a, 8c, 8e, and 8g and the high acoustic impedance layers 8b, 8d, and 8f, in other words, the plate wave is reflected at the upper surfaces of the low acoustic impedance layers 8a, 8c, 8e, and 8g. As a result, the energy of the plate wave is more efficiently confined in the piezoelectric thin film 4.

In various preferred embodiments of the present invention, the low acoustic impedance layers and the high acoustic impedance layers need not be alternately disposed in the stacking direction. From the viewpoint of further enhancing the plate wave confinement efficiency in the piezoelectric thin film 4, at least one of the low acoustic impedance layers is preferably provided on the piezoelectric thin film 4 side with respect to at least one high acoustic impedance layer.

In this preferred embodiment, the temperature coefficient of resonant frequency of at least one of the acoustic impedance layers of the acoustic reflecting layer 8 has a polarity opposite to that of the piezoelectric thin film 4. Thus, the elastic wave device 1 of this preferred embodiment has more outstanding frequency-temperature characteristics.

Furthermore, in a preferred embodiment of the present invention, the temperature coefficient of resonant frequency of at least one of the acoustic impedance layers of the acoustic reflecting layer 8 may have the same polarity as the temperature coefficient of resonant frequency of the piezoelectric thin film 4. In such a case, the absolute value of the temperature coefficient of resonant frequency of at least one of the acoustic impedance layers is preferably smaller than the absolute value of the temperature coefficient of resonant frequency of the piezoelectric thin film 4. In this case, the frequency-temperature characteristics of the elastic wave device 1 is able to be further improved.

The low acoustic impedance layers 8a, 8c, 8e, and 8g are composed of $SiO_2$. Alternatively, the low acoustic impedance layers 8a, 8c, 8e, and 8g may be composed of Al, Ti, or the like.

The high acoustic impedance layers 8b, 8d, and 8f are composed of AlN. Alternatively, the high acoustic impedance layers 8b, 8d, and 8f may be composed of W, $LiTaO_3$, $Al_2O_3$, $LiNbO_3$, SiN, ZnO, or the like. These materials of the high acoustic impedance layers 8b, 8d, and 8f may be used alone or in combination.

From the viewpoint of further efficiently confining the energy of the plate wave, the acoustic impedance layers of the acoustic reflecting layer 8 preferably each have a thickness in the range of about ⅓ of the thickness of the piezoelectric thin film 4 to about three times the thickness of the piezoelectric thin film 4, for example. The thickness of each of the acoustic impedance layers may be different from the thickness of the piezoelectric thin film 4.

In the elastic wave device 1, the acoustic reflecting layer 8 preferably includes seven acoustic impedance layers, for example. The number of the acoustic impedance layers stacked is not particularly limited, but is preferably 4 to 20 as in this preferred embodiment. When the number of the acoustic impedance layers stacked is within the above-described range, the energy of the plate wave is able to be further efficiently confined.

The acoustic reflecting layer 8 includes third and fourth main surfaces 8A and 8B. The third main surface 8A is in contact with the second main surface 4b of the piezoelectric thin film 4. The fourth main surface 8B is opposite to the third main surface 8A.

First through holes 11 and 12 are provided in the piezoelectric thin film 4 and the acoustic reflecting layer 8. The first through holes 11 and 12 extend from the fourth main surface 8B of the acoustic reflecting layer 8 toward the space 9. The first through holes 11 and 12 are used as etching holes in the production steps described below. The first through holes 11 and 12 connect the outside air to the space 9 provided by the recessed portion 2c.

A cover member 19 is disposed on the fourth main surface 8B of the acoustic reflecting layer 8 so as to cover the opening ends of the first through holes 11 and 12. The material of the cover member 19 is not particularly limited, but is preferably an inorganic material. In this case, moisture resistance of the elastic wave device 1 is able to be further enhanced. More specifically, Si, alumina, glass, sapphire, etc., can be used as the material of the cover member 19. Alternatively, the cover member 19 may be composed of a resin such as polyimide.

The thickness of the cover member 19 is more than or equal to about 25 μm and less than or equal to about 500 μm, for example. The reason behind this is as follows. When the thickness of the cover member 19 is small relative to the thickness of the piezoelectric thin film 4 and the intermediate layer, cracks may occur by the impact applied to the cover member 19 during the process of mounting the elastic wave device 1 onto a mounting board. However, it could be confirmed that, as long as the thickness of the piezoelectric thin film 4 is less than or equal to about 1 μm, the thickness of the intermediate layer is less than or equal to about 10 μm, and the thickness of the cover member 19 is more than or equal to about 25 μm, for example, the thickness of the cover member 19 is sufficiently large relative to the piezoelectric thin film 4 and the intermediate layer, and thus, the cover member 19 does not crack due to the improved strength of the cover member 19 even when an impact is applied to the cover member 19. Thus, the thickness of the piezoelectric thin film 4 is preferably less than or equal to about 1 μm, the thickness of the intermediate layer is preferably less than or equal to about 10 μm, and the thickness of the cover member 19 is preferably more than or equal to about 25 μm, for example. The thickness of the cover member 19 is more preferably more than or equal to about 50 μm, for example, since the strength of the cover member 19 is further improved.

Second layer wires 10a and 10b are provided in the piezoelectric thin film 4, the acoustic reflecting layer 8, and the cover member 19 in outer side portions with respect to the region where the recessed portion 2c is provided. More specifically, the second layer wires 10a and 10b are embedded in the piezoelectric thin film 4, the acoustic reflecting layer 8, and the cover member 19, and are electrically connected to the electrode lands 6 and 7. Thus, metal bumps and the like may be joined to the second layer wires 10a and 10b.

The second layer wires 10a and 10b can be made of an appropriate metal or alloy, such as a Cu, Ni, an AlCu alloy, Ti, Al, or Pt. The second layer wires 10a and 10b may each be defined by a multilayer metal film in which multiple metal films are stacked.

As previously mentioned, in the elastic wave device 1 of this preferred embodiment, the cover member 19 is provided on the fourth main surface 8B of the acoustic reflecting layer 8 so as to close the opening ends of the first through holes 11 and 12. Thus, moisture rarely penetrates into the region where the IDT electrode 5 is located in the elastic wave device 1. In other words, the elastic wave device 1 has excellent moisture resistance. Since the elastic wave device 1 has excellent moisture resistance, frequency fluctuation is rare, and reliability is excellent.

Although the method for producing the elastic wave device 1 is not particularly limited, one example method is described with reference to FIGS. 2A to 4C.

Figure 2A:
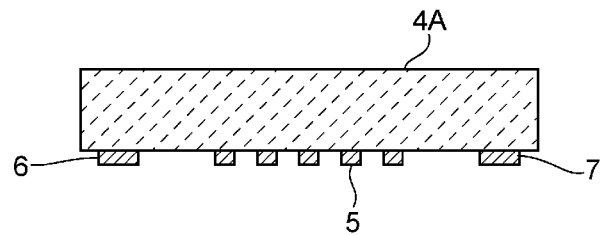
FIGS. 2A to 2D are schematic elevational cross-sectional views illustrating a method for producing the elastic wave device according to the first preferred embodiment of the present invention.

First, as illustrated in FIG. 2A, a piezoelectric plate 4A for obtaining the piezoelectric thin film 4 is prepared. The IDT electrode 5 and the electrode lands 6 and 7 are formed on a first main surface of the piezoelectric plate 4A.

A plate composed of $LiTaO_3$ is used as the piezoelectric plate 4A. Alternatively, a plate composed of other piezoelectric single crystal, such as $LiNbO_3$, or a plate composed of a piezoelectric ceramic may be used as the piezoelectric plate 4A.

The IDT electrode 5 can be formed by, for example, a vapor deposition lift-off method. The thickness of the IDT electrode 5 is not particularly limited, but is preferably about 10 nm to about 1000 nm, for example.

In this preferred embodiment, the IDT electrode 5 is formed of a multilayer metal film obtained by stacking Ti, Al, and Ti in this order. The IDT electrode 5 can be formed of an appropriate metal or alloy, such as a Ti, Cu, Al, Pt, an AlCu alloy, NiCr, or Ni.

After forming the IDT electrode 5, a $SiO_2$ that defines and functions as a temperature-characteristics-adjusting film may be formed on a main surface of the piezoelectric plate 4A on which the IDT electrode 5 is formed. The $SiO_2$ that defines and functions as a temperature-characteristics-adjusting film may be formed before formation of the IDT electrode 5.

Figure 2B:
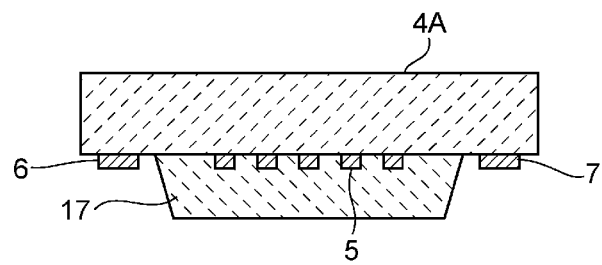

Next, as illustrated in FIG. 2B, a sacrificial layer 17 is formed so as to cover the IDT electrode 5. When the temperature-characteristics-adjusting film is formed, the sacrificial layer 17 is formed on the temperature-characteristics-adjusting film. The sacrificial layer 17 is composed of an appropriate material removable by etching described below. Examples of such a material include ZnO and Cu.

The sacrificial layer 17 can be formed by, for example, the following method. First, a film having a film thickness of about 1 μm to about 3 μm is formed by a sputtering method. Next, resist coating, exposure, and development are performed in this order. Next, wet etching is performed by using an acetic acid/phosphoric acid/water (1:1:10) mixture solution so as to form a pattern on the sacrificial layer 17, and the resist is stripped. The sacrificial layer 17 may be formed by other methods.

Figure 2C:
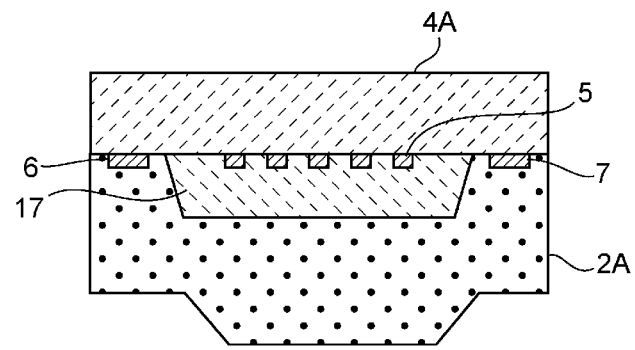

Next, as illustrated in FIG. 2C, a planarizing film 2A for obtaining the supporting substrate 2 is formed so as to cover the sacrificial layer 17. In this preferred embodiment, a $SiO_2$ film is formed as the planarizing film 2A. The planarizing film 2A can be formed by, for example, a sputtering method. The film thickness of the planarizing film 2A is preferably about 2 μm to about 8 μm.

Figure 2D:
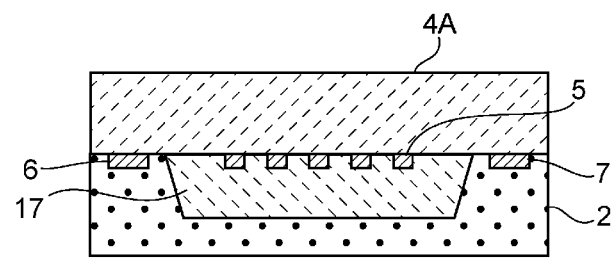

Next, as illustrated in FIG. 2D, the planarizing film 2A is planarized by polishing through chemical mechanical polishing (CMP). As a result, a supporting substrate 2 including a recessed portion is obtained.

Figure 3A:
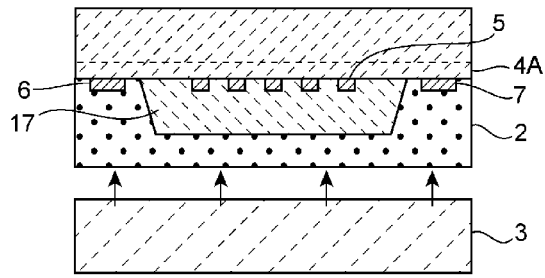
FIGS. 3A to 3D are schematic elevational cross-sectional views illustrating the method for producing the elastic wave device according to the first preferred embodiment of the present invention.

Next, as illustrated in FIG. 3A, the reinforcing substrate 3 is joined to the lower surface of the supporting substrate 2. The supporting substrate 2 and the reinforcing substrate 3 can be joined together by using, for example, a resin adhesive. The reinforcing substrate 3 is optional. However, the reinforcing substrate 3 facilitates the smoothing process for the piezoelectric plate 4A.

Figure 3B:
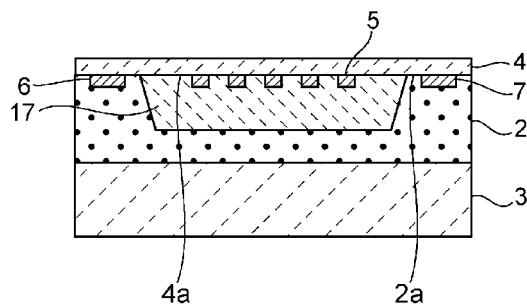

Next, the piezoelectric plate 4A is made thinner. As a result, a multilayer body illustrated in FIG. 3B is obtained. The multilayer body includes the reinforcing substrate 3, the supporting substrate 2 with a recessed portion in the upper surface, the sacrificial layer 17 filling the recessed portion, and the piezoelectric thin film 4 including the first main surface 4a on which the IDT electrode 5 is formed. The piezoelectric thin film 4 is stacked on the upper surface 2a of the supporting substrate so that the first main surface 4a is adjacent to the upper surface 2a.

The piezoelectric plate 4A can be made thinner by a stripping method involving ion injection, polishing, or the like. The thickness of the piezoelectric thin film 4 obtained by making the piezoelectric plate 4A thinner is preferably about 100 nm to about 1000 nm. From the viewpoint of further effectively enhancing the plate wave excitation efficiency, the thickness of the piezoelectric thin film 4 is more preferably about 100 nm to about 500 nm.

Figure 3C:
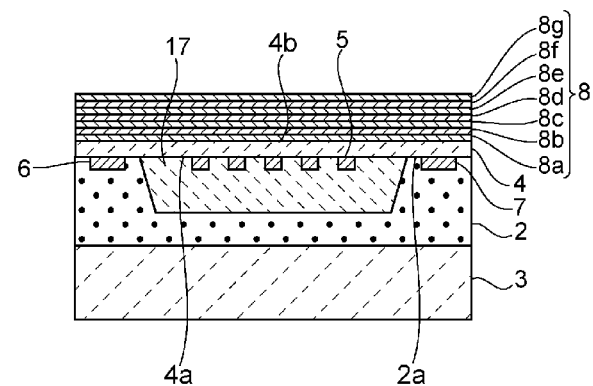

Next, as illustrated in FIG. 3C, the acoustic reflecting layer 8 defining and functioning an intermediate layer is formed on the second main surface 4b of the piezoelectric thin film 4. More specifically, the low acoustic impedance layer 8a composed of $SiO_2$ is formed on the second main surface 4b of the piezoelectric thin film 4 by sputtering. Subsequently, three high acoustic impedance layers 8b, 8d, and 8f composed of AlN and three low acoustic impedance layers 8c, 8e, and 8g are formed by sputtering so as to be alternately stacked. As a result, the acoustic reflecting layer 8 including a total of seven acoustic impedance layers is formed on the second main surface 4b of the piezoelectric thin film 4 ($SiO_2$/AlN/$SiO_2$/AlN/$SiO_2$/AlN/$SiO_2$/piezoelectric thin film 4).

The thickness of the each of the low acoustic impedance layers 8a, 8c, 8e, and 8g and the high acoustic impedance layers 8b, 8d, 8f is not particularly limited, but the thickness is preferably about ⅓ of the thickness of the piezoelectric thin film 4 to about three times the thickness of the piezoelectric thin film 4, for example. In this case, the efficiency of confining the plate wave energy in the piezoelectric thin film 4 is further enhanced.

Figure 3D:
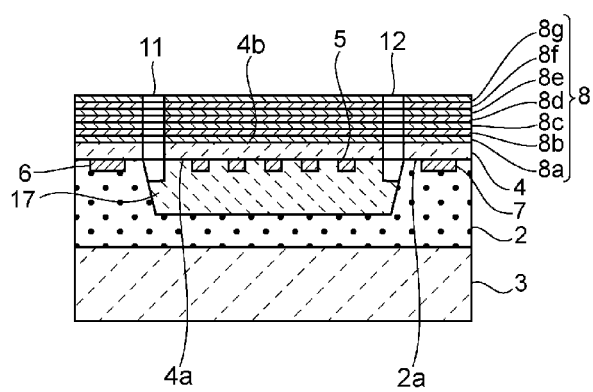

Next, as illustrated in FIG. 3D, the first through holes 11 and 12 are formed in the acoustic reflecting layer 8 and the piezoelectric thin film 4. The first through holes 11 and 12 are formed so as to reach the sacrificial layer 17. The first through holes 11 and 12 can be formed by, for example, a dry etching method (inductive coupled plasma-reactive ion etching (ICP-RIE)).

Figure 4A:
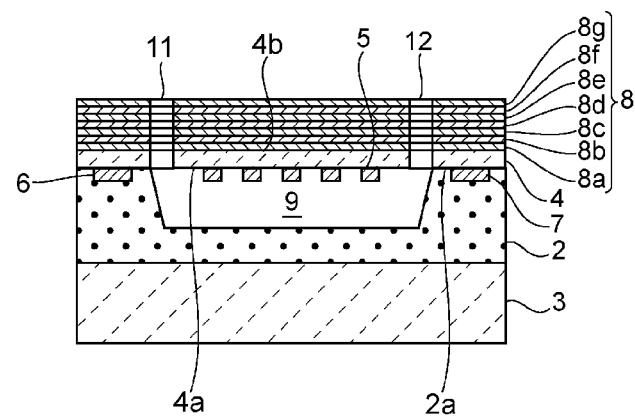
FIGS. 4A to 4C are schematic elevational cross-sectional views illustrating the method for producing the elastic wave device according to the first preferred embodiment of the present invention.

Next, as illustrated in FIG. 4A, the sacrificial layer 17 is removed by using the first through holes 11 and 12. The sacrificial layer 17 can be removed by, for example, wet etching by using an acetic acid/phosphoric acid/water (1:1:10) mixture solution.

Figure 4B:
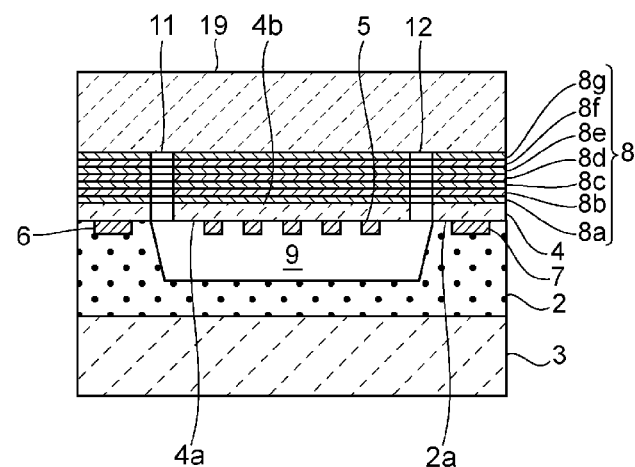

Next, as illustrated in FIG. 4B, the cover member 19 is formed on the acoustic reflecting layer 8. The cover member 19 can be joined to the acoustic reflecting layer 8 by using, for example, a resin adhesive. The cover member 19 is formed so as to cover the opening ends of the first through holes 11 and 12. In this preferred embodiment, a Si substrate is used as the cover member 19. However, the material for forming the cover member 19 is not particularly limited. From the viewpoint of further improving the moisture resistance, an inorganic material is preferably used to form the cover member 19.

Figure 4C:
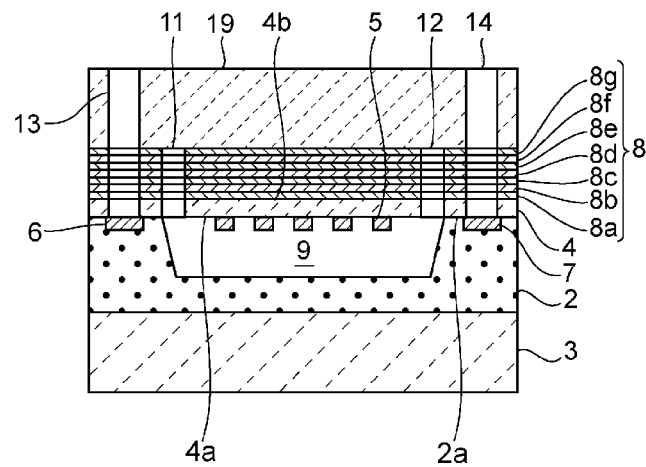

Next, as illustrated in FIG. 4C, second through holes 13 and 14 are formed in the acoustic reflecting layer 8, the piezoelectric thin film 4, and the cover member 19. The second through holes 13 and 14 can be formed by, for example, a dry etching method (inductive coupled plasma-reactive ion etching (ICP-RIE)). The second through holes 13 and 14 are formed so as to reach the electrode lands 6 and 7.

Next, plating films are grown in the second through holes 13 and 14 that face the electrode lands 6 and 7. As a result, the second layer wires 10a and 10b are formed, and the elastic wave device 1 illustrated in FIG. 1A (sacrificial layer-type membrane plate wave resonator) is obtained. The second layer wires 10a and 10b can be formed by a vapor deposition lift-off method. The second layer wires 10a and 10b preferably each have a thickness of about 100 nm to about 2000 nm.

In this preferred embodiment, the second layer wires 10a and 10b are each formed of a multilayer metal film obtained by stacking Ti and Al in this order. Alternatively, the second layer wires 10a and 10b may be formed by using other appropriate metals or alloys.

The elastic wave device 1 obtained as described above has excellent moisture resistance since the opening ends of the first through holes 11 and 12 are covered with the cover member 19. Moreover, since the elastic wave device 1 has excellent moisture resistance, frequency fluctuation is rare, and reliability is excellent.

Second Preferred Embodiment

Figure 5:
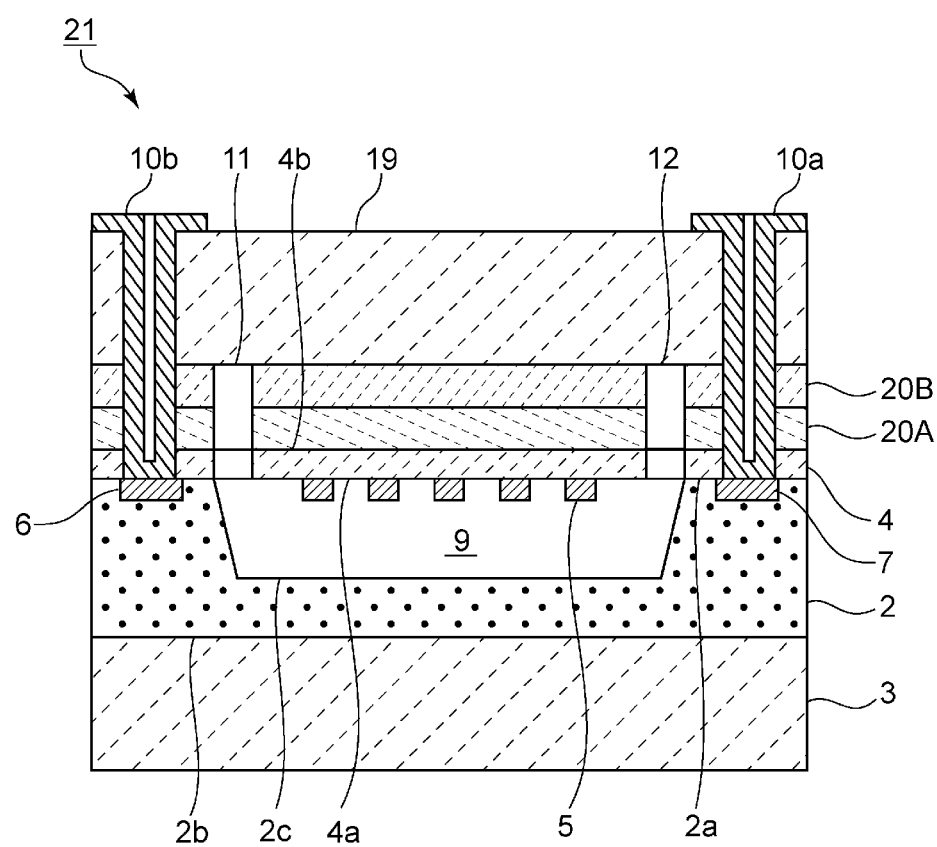
FIG. 5 is a schematic elevational cross-sectional view of an elastic wave device according to a second preferred embodiment of the present invention.

FIG. 5 is a schematic elevational cross-sectional view of an elastic wave device according to a second preferred embodiment of the present invention. In an elastic wave device 21, a low acoustic velocity layer 20A and a high acoustic velocity layer 20B are formed as the intermediate layer instead of the acoustic reflecting layer. The acoustic velocity of the bulk waves propagating in the low acoustic velocity layer 20A is lower than the acoustic velocity of the elastic wave propagating in the piezoelectric thin film 4. The high acoustic velocity layer 20B is formed on the low acoustic velocity layer 20A. The acoustic velocity of the bulk waves propagating in the high acoustic velocity layer 20B is higher than the acoustic velocity of the elastic wave propagating in the piezoelectric thin film 4.

In this preferred embodiment, silicon oxide is used in the low acoustic velocity layer 20A. Alternatively, the low acoustic velocity layer 20A can be made of any appropriate material having a bulk wave acoustic velocity lower than the acoustic velocity of the elastic wave propagating in the piezoelectric thin film 4. Examples of such materials include media mainly composed of a material such as silicon oxide, glass, silicon oxynitride, tantalum oxide, or a compound obtained by doping silicon oxide with fluorine, carbon, or boron.

The high acoustic velocity layer 20B confines the surface acoustic wave in the portion where the piezoelectric thin film 4 and the low acoustic velocity layer 20A are stacked so that the surface acoustic wave does not leak to the high acoustic velocity layer 20B and any structure above. In this preferred embodiment, the high acoustic velocity layer 20B is composed of aluminum nitride. However, as long as the elastic wave can be confined, various high acoustic velocity materials such as aluminum nitride, aluminum oxide, silicon carbide, silicon nitride, silicon oxynitride, a DLC film or diamond, media mainly composed of these materials, and media mainly composed of mixtures of these materials can be used. Other features are the same as in the first preferred embodiment.

The elastic wave device 21 also has excellent moisture resistance since the opening ends of the first through holes 11 and 12 are covered with the cover member 19. Since the elastic wave device 21 has excellent moisture resistance, frequency fluctuation is rare, and reliability is excellent.

Furthermore, since the intermediate layer of the elastic wave device 21 includes the low acoustic velocity layer 20A and the high acoustic velocity layer 20B, the elastic wave energy is further efficiently confined.

The method for producing the elastic wave device 21 is the same as the method for producing the elastic wave device 1 (FIGS. 2A to 4C) except for forming the low acoustic velocity layer 20A and the high acoustic velocity layer 20B illustrated in FIG. 5 instead of the acoustic reflecting layer 8.

Third Preferred Embodiment

Figure 6:
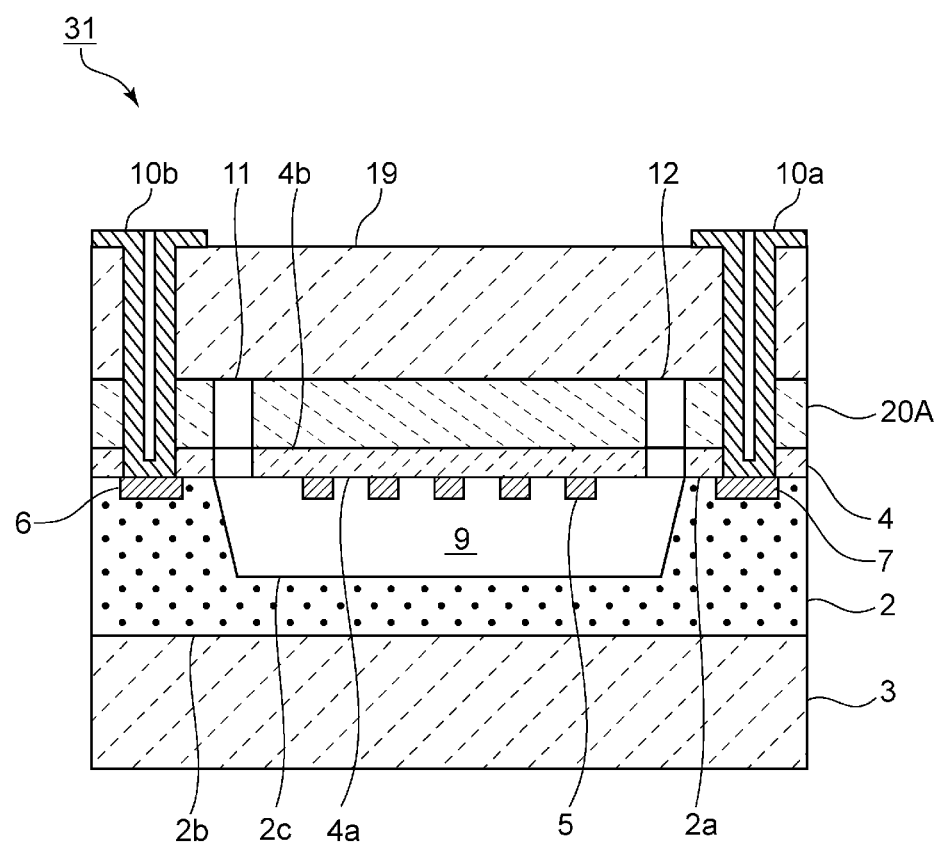
FIG. 6 is a schematic elevational cross-sectional view of an elastic wave device according to a third preferred embodiment of the present invention.

FIG. 6 is a schematic elevational cross-sectional view of an elastic wave device according to a third preferred embodiment of the present invention. In an elastic wave device 31, a low acoustic velocity layer 20A is formed as the intermediate layer instead of the acoustic reflecting layer. The acoustic velocity of the bulk waves propagating in the low acoustic velocity layer 20A is lower than the acoustic velocity of the elastic wave propagating in the piezoelectric thin film 4. The cover member 19 is a high acoustic velocity member, in which the acoustic velocity of the bulk waves propagating therein is higher than the acoustic velocity of the elastic wave propagating in the piezoelectric thin film 4. In this preferred embodiment, silicon oxide is used in the low acoustic velocity layer 20A. Alternatively, the low acoustic velocity layer 20A can use any appropriate material having a bulk wave acoustic velocity lower than the acoustic velocity of the elastic wave propagating in the piezoelectric thin film 4. Examples of such materials include media mainly composed of a material such as silicon oxide, glass, silicon oxynitride, tantalum oxide, or a compound obtained by doping silicon oxide with fluorine, carbon, or boron.

The high acoustic velocity member confines the surface acoustic wave in the portion where the piezoelectric thin film 4 and the low acoustic velocity layer 20A are stacked so that the surface acoustic wave does not leak to the high acoustic velocity material or any structure above. In this preferred embodiment, the high acoustic velocity member is composed of aluminum nitride. However, as long as the elastic wave can be confined, various high acoustic velocity materials such as aluminum nitride, aluminum oxide, silicon carbide, silicon nitride, silicon oxynitride, a DLC film or diamond, media mainly composed of these materials, and media mainly composed of mixtures of these materials can be used. Other features are the same as in the first preferred embodiment.

The elastic wave device 31 also has excellent moisture resistance since the opening ends of the first through holes 11 and 12 are covered with the cover member 19. Since the elastic wave device 31 has excellent moisture resistance, frequency fluctuation is rare, and reliability is excellent.

Furthermore, since the intermediate layer of the elastic wave device 31 is the low acoustic velocity layer 20A, and the cover member 19 also defines and functions as the high acoustic velocity member, the elastic wave energy is further efficiently confined.

The method for producing the elastic wave device 31 is the same as the method for producing the elastic wave device 1 (FIGS. 2A to 4C) except for forming the low acoustic velocity layer 20A illustrated in FIG. 6 instead of the acoustic reflecting layer 8.

Fourth Preferred Embodiment

Figure 7:
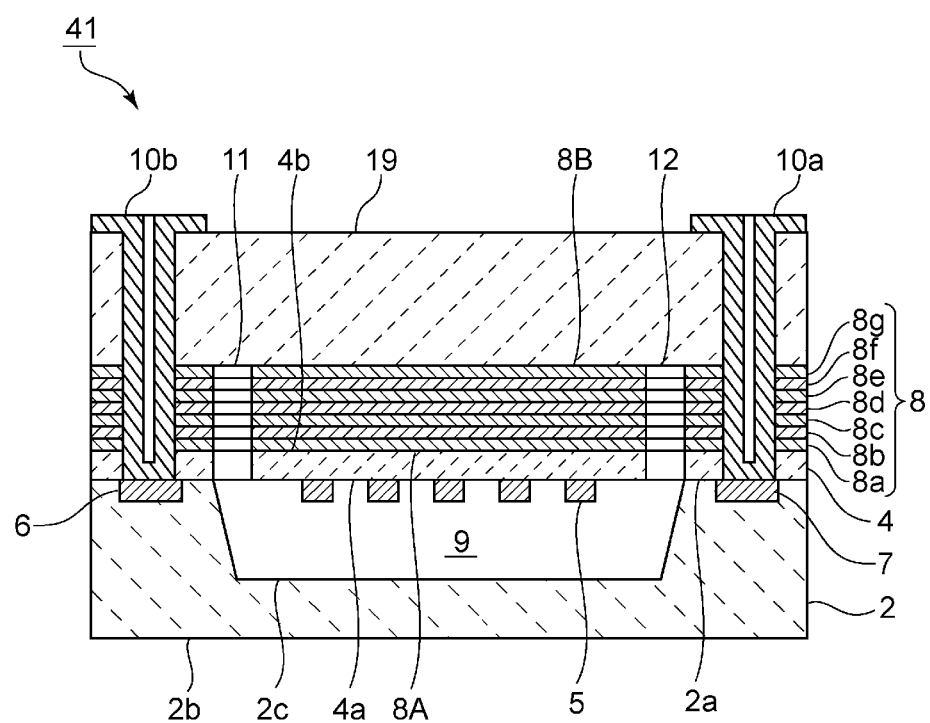
FIG. 7 is a schematic elevational cross-sectional view of an elastic wave device according to a fourth preferred embodiment of the present invention.

FIG. 7 is a schematic elevational cross-sectional view of an elastic wave device according to a fourth preferred embodiment of the present invention. An elastic wave device 41 does not have the reinforcing substrate 3, and the supporting substrate 2 also defines and functions as the reinforcing substrate 3. Other features are the same as in the first preferred embodiment.

The elastic wave device 41 also has excellent moisture resistance since the opening ends of the first through holes 11 and 12 are covered with the cover member 19. Since the elastic wave device 41 has excellent moisture resistance, frequency fluctuation is rare, and reliability is excellent.

The method for producing the elastic wave device 41 is the same as the method for producing the elastic wave device 1 (FIGS. 2A to 4C) except for not forming the reinforcing substrate 3.

Fifth Preferred Embodiment

Figure 8:
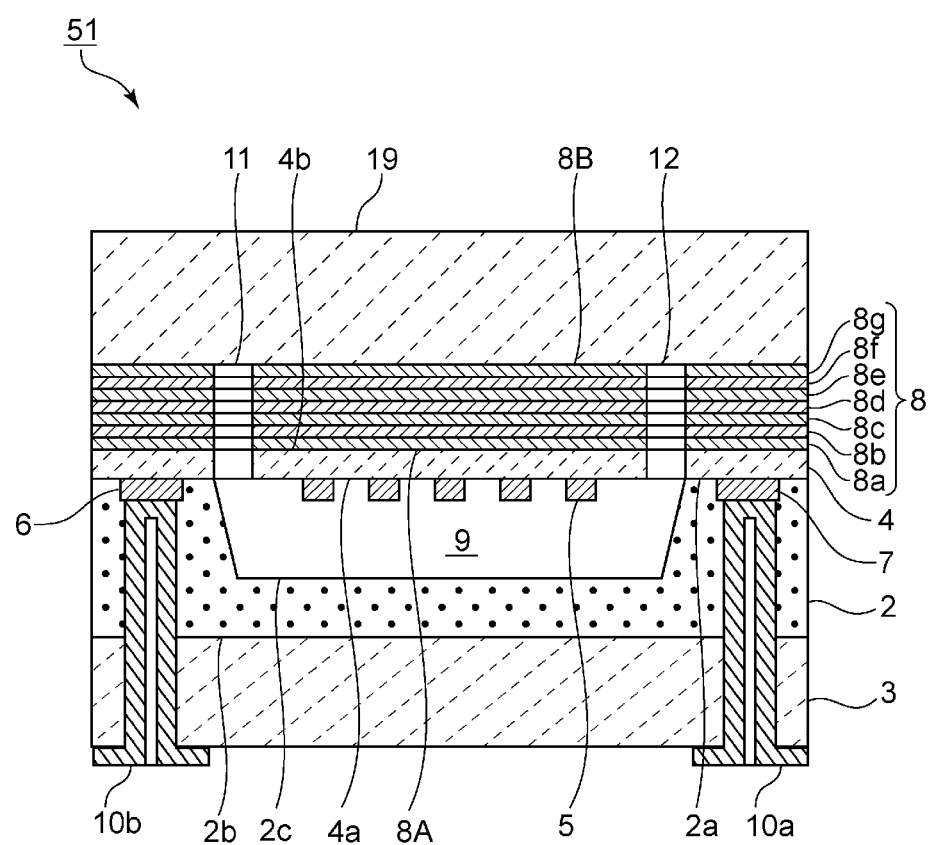
FIG. 8 is a schematic elevational cross-sectional view of an elastic wave device according to a fifth preferred embodiment of the present invention.

FIG. 8 is a schematic elevational cross-sectional view of an elastic wave device according to a fifth preferred embodiment of the present invention. In an elastic wave device 51, the second layer wires 10a and 10b are not embedded in the piezoelectric thin film 4, the acoustic reflecting layer 8, and the cover member 19. In the elastic wave device 51, the second layer wires 10a and 10b are embedded in the supporting substrate 2 and the reinforcing substrate 3, and are electrically connected to the electrode lands 6 and 7. Other features are the same as in the first preferred embodiment.

The elastic wave device 51 also has excellent moisture resistance since the opening ends of the first through holes 11 and 12 are covered with the cover member 19. Since the elastic wave device 51 has excellent moisture resistance, frequency fluctuation is rare, and reliability is excellent.

In the method for producing the elastic wave device 51, the second through holes 13 and 14 are not formed in the acoustic reflecting layer 8, the piezoelectric thin film 4, and the cover member 19, and through holes are formed in the supporting substrate 2 and the reinforcing substrate 3. The through holes are formed so as to reach the electrode lands 6 and 7. Next, plating films are grown in the through holes that face the electrode lands 6 and 7. As a result, the second layer wires 10a and 10b are formed, and the elastic wave device 51 illustrated in 8 is obtained. Other features are the same as in the method for producing the elastic wave device 1 (FIGS. 2A to 4C).

Sixth Preferred Embodiment

Figure 9:
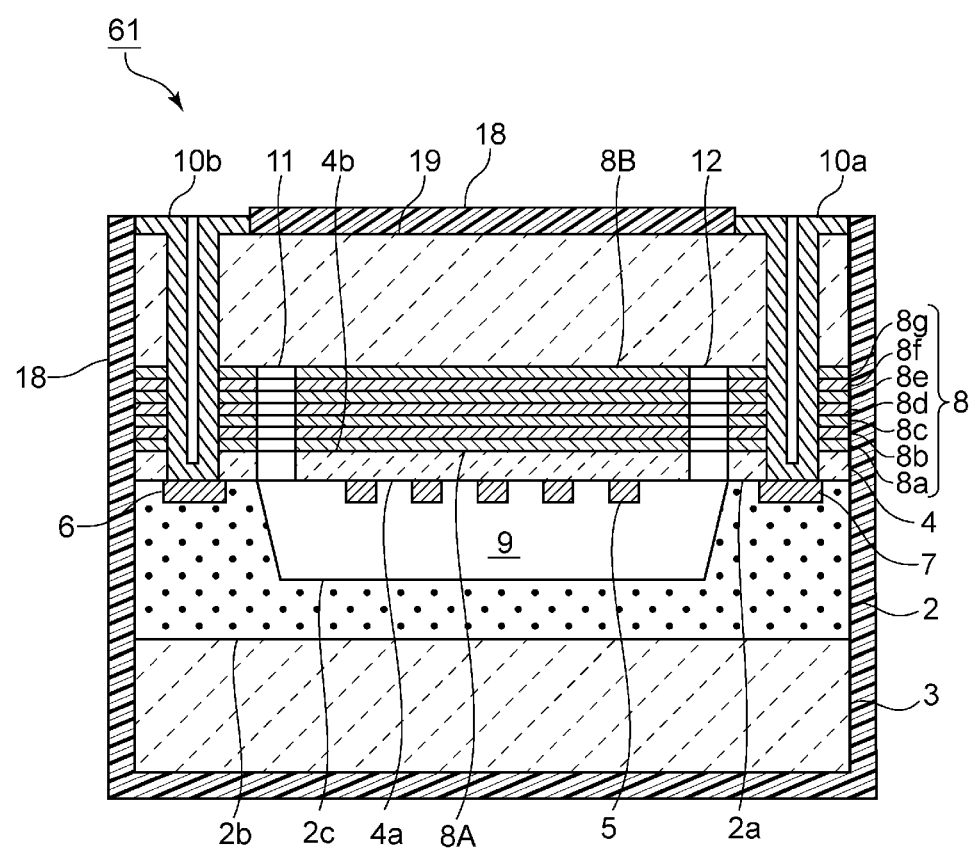
FIG. 9 is a schematic elevational cross-sectional view of an elastic wave device according to a sixth preferred embodiment of the present invention.

FIG. 9 is a schematic elevational cross-sectional view of an elastic wave device according to a sixth preferred embodiment of the present invention. In an elastic wave device 61, a packaging material 18 covers the reinforcing substrate 3, the supporting substrate 2, the piezoelectric thin film 4, the acoustic reflecting layer 8, and the cover member 19.

Alternatively, the packaging material 18 may be provided only at an upper side of FIG. 9, that is, in a region directly above the acoustic reflecting layer 8, the piezoelectric thin film 4, and the cover member 19. The packaging material 18 is not provided on the second layer wires 10a and 10b. The packaging material 18 is composed of a resin. Other features are the same as in the first preferred embodiment.

The elastic wave device 61 also has excellent moisture resistance since the opening ends of the first through holes 11 and 12 are covered with the cover member 19. Since the elastic wave device 61 has excellent moisture resistance, frequency fluctuation is rare, and reliability is excellent.

When the packaging material 18 is composed of a resin, the packaging material 18 can be formed by merely performing application and curing. Thus, production of the elastic wave device 61 is simpler. Alternatively, the packaging material 18 may be composed of a polyimide, a photosensitive polyimide, or the like.

The method for producing the elastic wave device 61 is the same as the method for producing the elastic wave device 1 (FIGS. 2A to 4C) except for that the packaging material 18 is added to the elastic wave device 1 of the first preferred embodiment.

More specifically, in the method for producing the elastic wave device 61, after performing the method for producing the elastic wave device 1 (FIGS. 2A to 4C), the packaging material 18 is directly stacked on the cover member 19 as illustrated in FIG. 9. The stacking method may involve, for example, applying a photosensitive polyimide to the cover member 19, thermally curing the applied photosensitive polyimide, and performing exposure and development. As a result, the packaging material 18 is formed in the needed region only.

Seventh Preferred Embodiment

Figure 10:
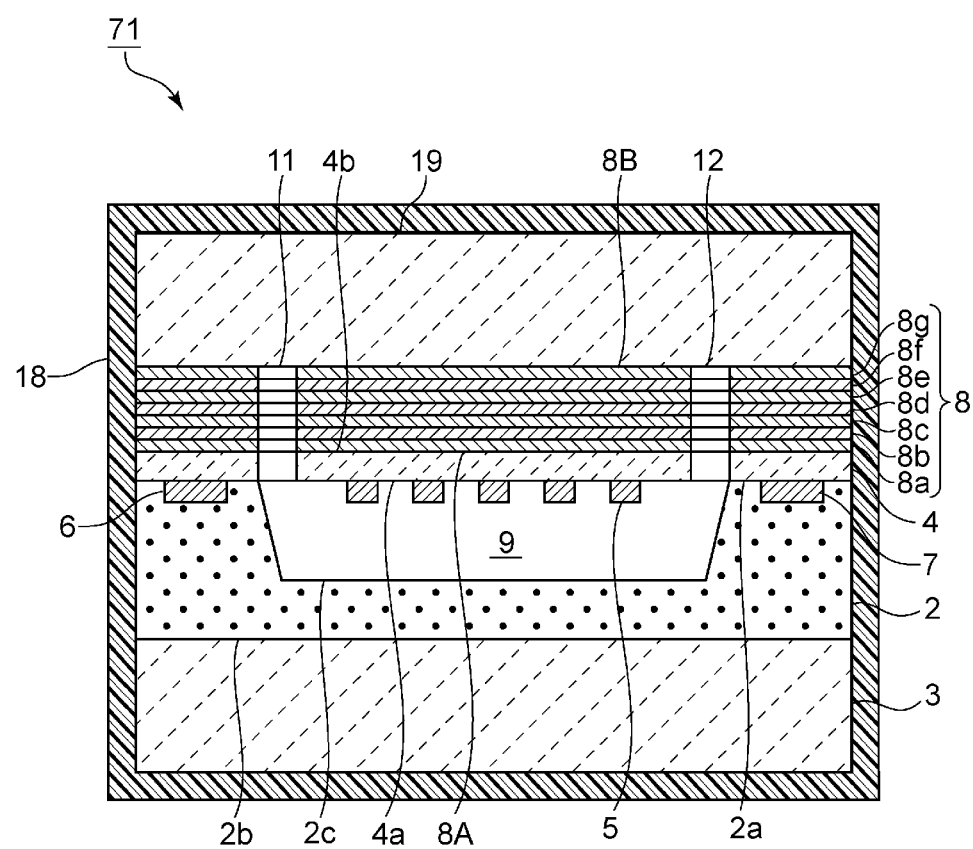
FIG. 10 is a schematic elevational cross-sectional view of an elastic wave device according to a seventh preferred embodiment of the present invention.
Figure 11A:
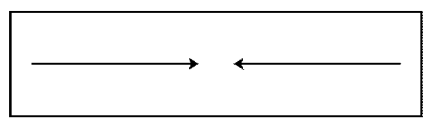
FIGS. 11A to 11F are schematic diagrams illustrating the S modes and the A modes of Lamb waves, and the propagation modes of SH waves.
Figure 11B:
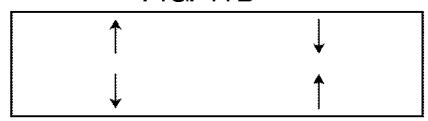
Figure 11C:
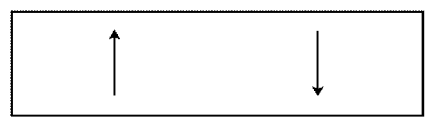
Figure 11D:
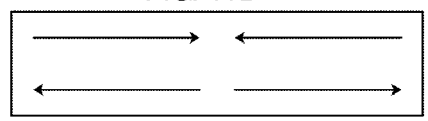
Figure 11E:
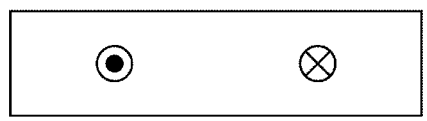
Figure 11F:

FIG. 10 is a schematic elevational cross-sectional view of an elastic wave device according to a seventh preferred embodiment of the present invention. The seventh preferred embodiment is a modification of the sixth preferred embodiment. The difference from the sixth preferred embodiment is that the second layer wires 10a and 10b are not clearly described. This is because the wires that connect the elastic wave device 71 to the external may take any form, and are not limited to those of the sixth preferred embodiment. For example, after the packaging material 18 is directly stacked on the cover member 19, wires for external connections may be formed. Other features are the same as in the sixth preferred embodiment.

The packaging material 18 may be formed only at an upper side of FIG. 10, that is, in a region directly above the acoustic reflecting layer 8, the piezoelectric thin film 4, and the cover member 19.

The method for producing the elastic wave device 71 is the same as that for the elastic wave device 61 of the sixth preferred embodiment (FIGS. 2A to 4C) except for the portion that involves the second layer wires 10a and 10b.

The elastic wave devices according to preferred embodiments of the present invention are widely applicable for use in various electronic appliances and communication devices. An example of the electronic appliance is a sensor. Examples of the communication device include a duplexer that includes one or more of the elastic wave devices of preferred embodiments of the present invention, a communication module device that includes one or more of the elastic wave devices according to preferred embodiments of the present invention, a power amplifier (PA) and/or a low noise amplifier (LNA) and/or a switch (SW), and a mobile communication device and a healthcare communication device that include the communication module devices. Examples of the mobile communication device include a cellular phone, a smart phone, and a car navigation system. Examples of the healthcare communication device include a weight scale and a body fat scale. The healthcare communication device and the mobile communication device are equipped with an antenna, an RF module, an LSI, a display, an input unit, a power supply, etc.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:
1. An elastic wave device comprising:
a supporting substrate including an upper surface with a recessed portion provided therein;
a piezoelectric thin film including first and second main surfaces opposite to each other, the piezoelectric thin film being provided on the supporting substrate so as to cover the recessed portion of the supporting substrate;
an IDT electrode provided on the first main surface of the piezoelectric thin film, the first main surface being adjacent to the supporting substrate; and
an intermediate layer including third and fourth main surfaces opposite to each other, the intermediate layer being provided on the second main surface, the second main surface being remote from the supporting substrate; wherein
a space is defined by the supporting substrate and the piezoelectric thin film;
the IDT electrode faces the space;
a through hole is provided in the piezoelectric thin film and the intermediate layer to extend from the third main surface to the space, the third main surface being remote from the piezoelectric thin film; and the elastic wave device further comprises a cover member disposed on the intermediate layer so as to cover an opening end of the through hole.

2. The elastic wave device according to claim 1, wherein the intermediate layer is an acoustic reflecting layer that includes a plurality of acoustic impedance layers; and the plurality of acoustic impedance layers includes at least one low acoustic impedance layer and at least one high acoustic impedance layer having a higher acoustic impedance than the low acoustic impedance layer.

3. The elastic wave device according to claim 1, wherein the intermediate layer includes a low acoustic velocity layer in which an acoustic velocity of a bulk wave propagating therein is lower than an acoustic velocity of an elastic wave propagating in the piezoelectric thin film, and a high acoustic velocity layer in which an acoustic velocity of a bulk wave propagating therein is higher than the acoustic velocity of the elastic wave propagating in the piezoelectric thin film, the high acoustic velocity layer being disposed on the low acoustic velocity layer.

4. The elastic wave device according to claim 1, wherein the intermediate layer is a low acoustic velocity layer in which an acoustic velocity of a bulk wave propagating therein is lower than an acoustic velocity of an elastic wave propagating in the piezoelectric thin film; and the cover member is a high acoustic velocity layer in which an acoustic velocity of a bulk wave propagating therein is higher than the acoustic velocity of the elastic wave propagating in the piezoelectric thin film.

5. The elastic wave device according to claim 1, wherein the cover member is made of an inorganic material.

6. The elastic wave device according to claim 1, wherein the cover member is made of Si.

7. The elastic wave device according to claim 1, wherein the piezoelectric thin film has a thickness less than or equal to about 1 μm; the intermediate layer has a thickness less than or equal to about 10 μm, and the cover member has a thickness more than or equal to about 25 μm.

8. The elastic wave device according to claim 1, wherein the elastic wave device is structured to generate a plate wave.

9. The elastic wave device according to claim 1, further comprising a reinforcing substrate on a lower surface of the supporting substrate.

10. The elastic wave device according to claim 1, wherein the piezoelectric thin film has a thickness less than or equal to about 1λ, where λ is a wavelength determined by an electrode finger pitch of the IDT electrode.

11. The elastic wave device according to claim 1, wherein the piezoelectric thin film has a thickness less than or equal to about 3.5λ, where λ is a wavelength determined by an electrode finger pitch of the IDT electrode.

12. The elastic wave device according to claim 1, further comprising reflectors on both sides of the IDT electrode.

13. The elastic wave device according to claim 2, wherein a temperature coefficient of resonant frequency of at least one of the acoustic impedance layers of the acoustic reflecting layer has a polarity opposite to that of the piezoelectric thin film.

14. The elastic wave device according to claim 2, wherein a temperature coefficient of resonant frequency of at least one of the acoustic impedance layers of the acoustic reflecting layer has a polarity that is the same as that of the piezoelectric thin film.

15. The elastic wave device according to claim 2, wherein an absolute value of a temperature coefficient of resonant frequency of at least one of the acoustic impedance layers is smaller than an absolute value of a temperature coefficient of resonant frequency of the piezoelectric thin film.

16. The elastic wave device according to claim 2, wherein the acoustic impedance layers each have a thickness in a range of about ⅓ of a thickness of the piezoelectric thin film to about three times the thickness of the piezoelectric thin film.

17. The elastic wave device according to claim 2, wherein a number of the plurality of acoustic impedance layers is between 4 and 20.

18. The elastic wave device according to claim 1, wherein a thickness of the cover member is more than or equal to about 25 μm and less than or equal to about 500 μm.

19. A method for producing an elastic wave device, the method comprising:
forming an IDT electrode on a piezoelectric thin film including first and second main surfaces opposite to each other;
forming a sacrificial layer on the first main surfaces of the piezoelectric thin film so as to cover the IDT electrode;
forming a supporting substrate, which includes an upper surface with a recessed portion formed therein, so as to cover the sacrificial layer;
forming an intermediate layer including third and fourth main surfaces opposite to each other, the intermediate layer being formed on the second main surface, the second main surfaces being remote from the sacrificial layer;
forming a through hole in the piezoelectric thin film and the intermediate layer so that the through hole extends from the third main surface to the sacrificial layer, the third main surface being remote from the piezoelectric thin film;
removing the sacrificial layer by etching through the through hole so that a portion where the sacrificial layer has been formed forms a space; and
forming a cover member on the one of the main surfaces of the intermediate layer remote from the piezoelectric thin film so as to cover an opening end of the through hole.

20. The method according to claim 19, wherein the cover member is made of an inorganic material.

* * * * *